United States Patent
Ushiyama

[11] Patent Number: 5,959,505
[45] Date of Patent: Sep. 28, 1999

[54] CRYSTAL OSCILLATOR FOR MEASURING CRYSTAL IMPEDANCE OF A CRYSTAL UNIT

[75] Inventor: Hajime Ushiyama, Chino, Japan

[73] Assignee: Suwadenshi Co., Ltd., Nagano, Japan

[21] Appl. No.: 08/998,895

[22] Filed: Dec. 29, 1997

[30]       Foreign Application Priority Data

Jun. 9, 1997   [JP]   Japan .................................. 9-151420

[51] Int. Cl.⁶ .............................. H03B 5/36; G01R 29/22
[52] U.S. Cl. ......................... 331/158; 331/44; 331/161; 324/727
[58] Field of Search .................................. 331/44, 116 R, 331/116 FE, 158, 161, 175, 177 R, 185, 186; 324/652, 727

[56]             References Cited

U.S. PATENT DOCUMENTS 3,676,801   7/1972   Musa .................................. 331/116 FE
5,142,251   8/1992   Boomer .............................. 331/116 FE

*Primary Examiner*—David Mis
*Attorney, Agent, or Firm*—Armstrong, Westerman, Hattori, McLeland & Naughton

[57]             ABSTRACT

A crystal oscillator for measuring crystal impedance (CI) easily and accurately of various crystal units having an oscillating frequency in a wide band and various CI-values in a broad rage. A DC input voltage is measured, representing CI of a crystal unit, in a crystal oscillator, wherein an integrating circuit is provided in an output section providing a frequency oscillated from the crystal unit as an output, and one or more AGC amplifiers having an amplification rate proportional to a DC input voltage is provided between the crystal unit and the integrating circuit.

6 Claims, 6 Drawing Sheets

CRYSTAL OSCILLATOR FOR MEASURING CRYSTAL IMPEDANCE OF A CRYSTAL UNIT

BACKGROUND OF THE INVENTION

1. Field of the Invention

The present invention relates to a crystal oscillator for measuring crystal impedance (CI) of a crystal unit.

2. Description of the Related Art

The resistance substitution method is conventionally known as a method of measuring crystal impedance (CI) of a crystal unit.

In the resistance substitution method, a crystal unit to be measured is incorporated into a feedback loop of a self-oscillator, and an impedance upon completely serially exciting the crystal unit to be measured is measured as representing CI of the crystal unit.

In the resistance substitution method, however, it is necessary to measure CI under a pure serial resonance frequency. Oscillation is therefore at a frequency different from the actual oscillation frequency. Another problem is that adjustment and setting of an oscillation frequency and setting of a driving power of the crystal unit take a long period of time. When measuring CI of a crystal unit for diverse and various oscillation frequencies, there are required very complicated operations such as switching of frequency ranges and setting of an oscillation level.

SUMMARY OF THE INVENTION

In view of the foregoing, it is an object of the present invention to provide a novel CI measuring method and circuit which solves the conventional problems, and permits easy and highly accurate measurement of CI of various crystal units having oscillation frequencies in a wide band or CI-values within a broad range, and a novel crystal oscillator which, provides a highly stable output.

BRIEF DESCRIPTION OF THE DRAWINGS

The foregoing and other objects, features and advantages of the present invention will be better understood from the following detailed description, taken in conjunction with the accompanying drawings, in which.

DETAILED DESCRIPTION OF THE PREFERRED EMBODIMENTS

Now, the present invention will be described further in detail by means of embodiments with reference to the attached drawings.

EMBODIMENT 1

Figure 1:
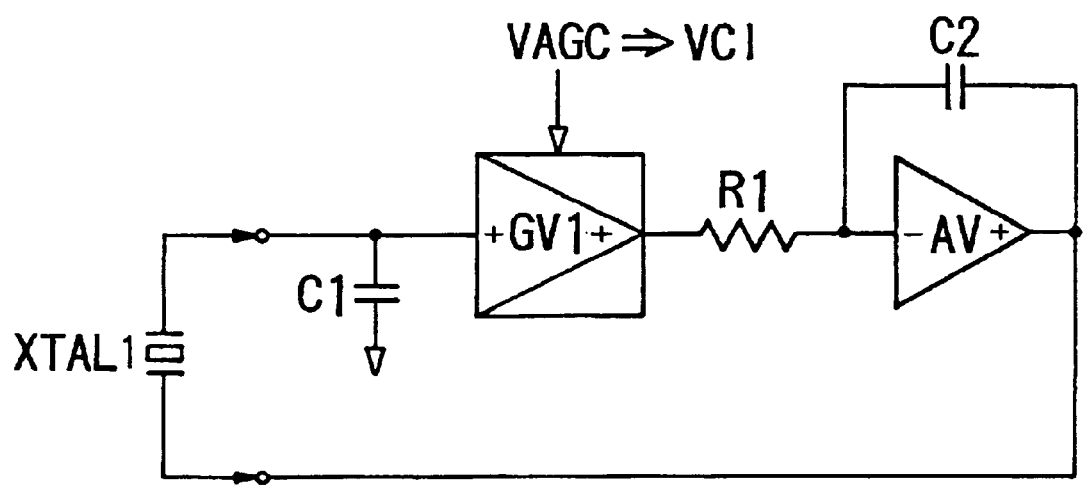
FIG. 1 is a diagram illustrating one embodiment of the crystal oscillator used in the method of measuring CI of a crystal unit of the present invention.

FIG. 1 illustrates a typical crystal oscillator used in the CIRCUIT FOR measuring CI of a crystal unit of the present invention.

In the crystal oscillator shown in FIG. 1, XTAL1 is a sample crystal unit, GV1 is an Automatic Gain Control (AGC) amplifier of which the amplification rate varies in proportion to a DC input voltage VAGC, and C1 is an input capacity of the oscillator. R1, C2 and AV are resistance, capacitance, and a high-amplification-rate amplifier, respectively, forming an integrating circuit.

The integrating circuit has a configuration in which a resistance R1 is connected to an input side of the high-amplification-rate amplifier AV, and a capacitance C2 is connected in parallel between input and output of the high-amplification-rate amplifier AV, and is provided in an output section for providing a frequency oscillated from a crystal unit XTAL1 as an output.

Figure 2:
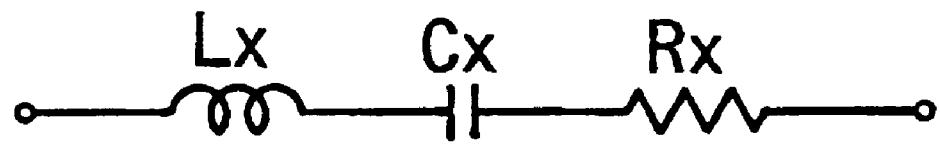
FIG. 2 is a diagram illustrating an equivalent circuit of a crystal unit.

FIG. 2 illustrates an equivalent circuit of a crystal unit: Lx, Cx, and Rx represent, respectively, an equivalent serial resonance inductance, an equivalent capacitance and an equivalent resistance of the crystal unit.

As is clear from FIGS. 1 and 2, a condition for sustained oscillation of the crystal oscillator having an integrating circuit in the output section thereof, is expressed by the following formula, if the serial resonance resistance of the crystal unit Rx is CI:

$$\frac{GV1}{\omega^2 \cdot C1 \cdot C2 \cdot R1} = CI$$

where, $$\omega = \frac{1}{\sqrt{Lx \cdot Cx}} \left(1 + \frac{1}{2} \cdot \frac{Cx}{C1}\right)$$

CI in this formula is proportional to the amplification rate (in the above formula, GV1=amplification rate) of the AGC amplifier GV1 of the oscillator. Therefore, the DC input voltage VAGC can be measured as a value proportional to CI of the crystal unit XTAL1 by employing the AGC amplifier GV1 having an amplification rate proportional to the DC input voltage VAGC, when oscillation stabilizes within the range of linear operation of the AGC amplifier GV1. An accurate CI is therefore easily available.

Because the integrating circuit is provided in the output section, it is possible to easily correct a change in CI caused by the oscillated frequency, thus permitting measurement of frequencies within a wide band and CI values within a large range.

EMBODIMENT 2

Figure 3:
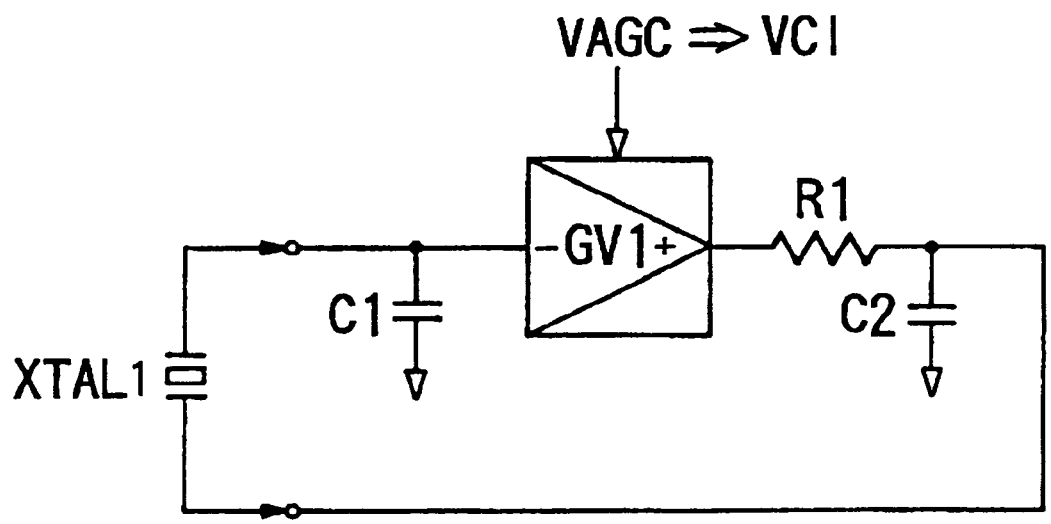
FIG. 3 is a diagram illustrating another embodiment of the crystal oscillator used in the method of measuring CI of a crystal unit of the present invention.

FIG. 3 illustrates another embodiment of the crystal oscillator used in the circuit for measuring CI of a crystal unit of the present invention.

The crystal oscillator shown in FIG. 3 is of the Colpitts type: XTAL1 is a crystal unit, Cl is an input capacitance of the oscillator, C2 is an output capacitance, R1 is an output resistance, and GV1 is an AGC amplifier having an amplification rate proportional to the DC input voltage VAGC, and the AGC amplifier GV1 is connected between the crystal unit XTAL1 and the output resistance R1.

The condition for sustained oscillation in the crystal oscillator shown in FIG. 3 can be expressed, from FIG. 3 and FIG. 2 described above, by the following formula:

$$\frac{GV1 \cdot C2/C1 \cdot R1}{1+\omega^2 \cdot C2^2 \cdot R1^2} = CI$$

where, $$\omega = \frac{1}{\sqrt{Lx \cdot Cx}}\left\{1 + \frac{1}{2}\left(\frac{Cx}{C1} + \frac{Cx}{C2} + \frac{Cx \cdot CI}{C2 \cdot R1}\right)\right\}$$

As is clear from this formula, CI is proportional to the amplification rate (in the above formula, GV1=amplification rate) of the AGC amplifier GV1. Therefore, by using an AGC amplifier GV1 having an amplification rate accurately proportional to the DC input voltage VAGC, such as a multiplier circuit, when oscillation stabilizes within the linear operation of AGC amplifier GV1, it is possible to easily and accurately obtain CI of the crystal unit by measuring the DC input voltage VAGC and regarding the thus measured DC input voltage VAGC as a value proportional to CI of the crystal unit XTAL1.

EMBODIMENT 3

Figure 4:
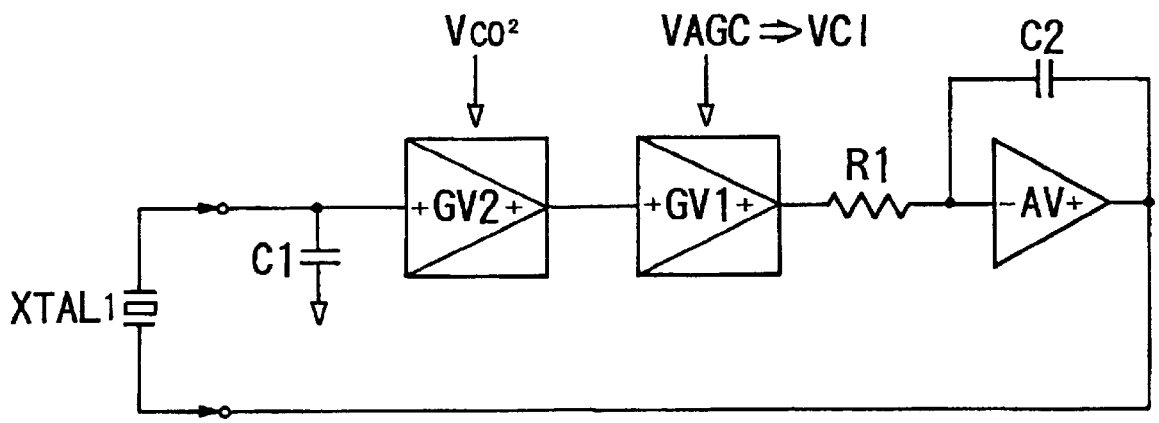
FIG. 4 is a diagram illustrating an embodiment of the crystal oscillator used in the method of measuring CI of a crystal unit of the present invention.

FIG. 4 illustrates another embodiment of the crystal oscillator used in the method of measuring CI of a crystal unit of the invention.

In FIG. 4, GV2 represents a variable amplifier serving as a second AGC amplifier having an amplification rate proportional to a square of the oscillated angular frequency ($=\omega^2$). This variable amplifier GV2 is connected in series between the AGC amplifier GV1 and the crystal unit XTAL1. A high-speed multiplier, for example, may be used as the first AGC amplifier GV1 and the second AGC amplifier GV2. All the other requirements are the same as those for the crystal oscillator shown in FIG. 1.

In the crystal oscillator shown in FIG. 1, the above-mentioned formula representing the condition for sustained oscillation contains $\omega^2$, and it is suggested that CI of the crystal unit is inevitably affected by the oscillated angular frequency $\omega$. As shown in FIG. 4, therefore, by connecting the variable amplifier GV2 having an amplification rate proportional to a square of the oscillated angular frequency ($=\omega^2$), it is possible to easily correct the oscillated angular frequency $\omega$, and by using a broad-band crystal oscillator, it is possible to accurately measure CI of a crystal unit within a wider range of frequencies.

In the Colpitts type crystal oscillator shown in FIG. 3, the above-mentioned formula contains the term of $\omega$ in the form of $1+\omega^2 \cdot C2^2 \cdot R1^2$. A wider band can therefore be achieved by the use of a computer.

EMBODIMENT 4

Figure 5:
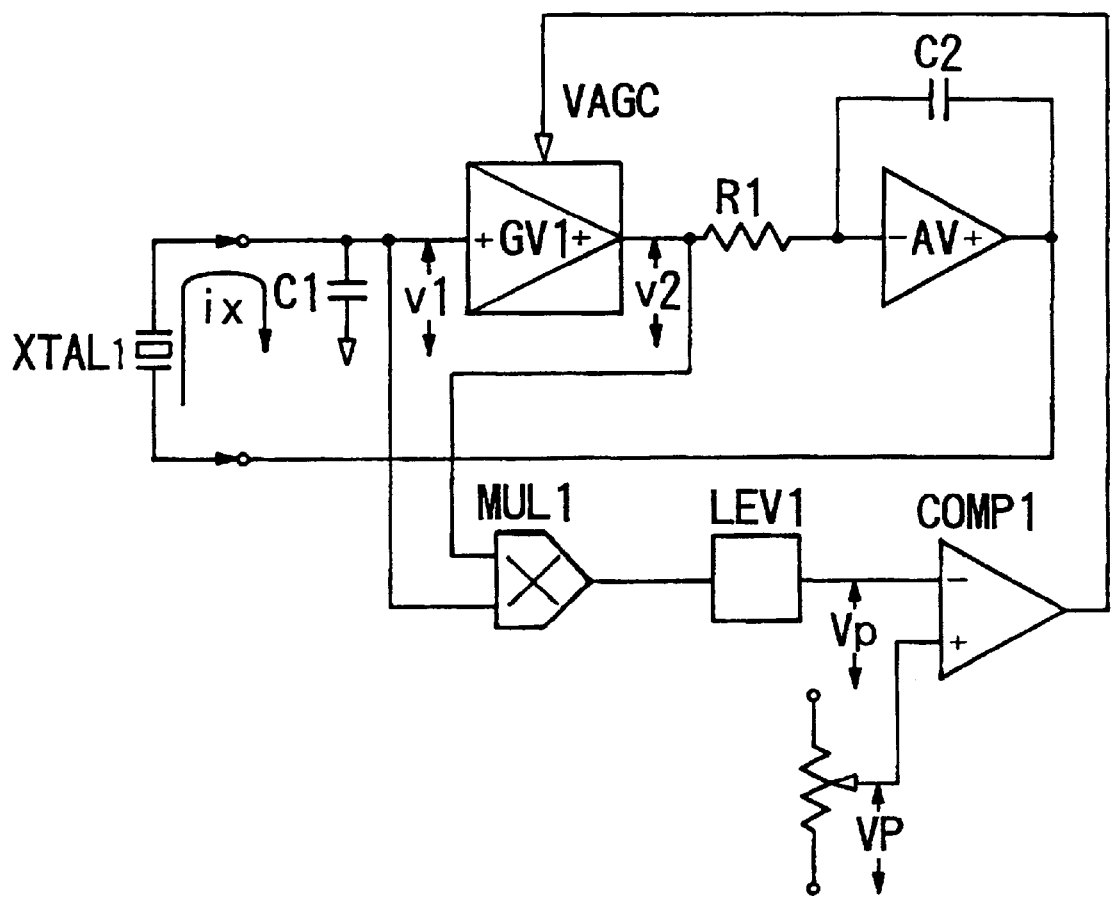
FIG. 5 is a diagram illustrating an embodiment of the crystal oscillator used in the method of measuring CI of a crystal unit of the present invention; and, FIG. 6 is a diagram illustrating an embodiment of the DC input voltage VAGC generating circuit.

FIG. 5 illustrates a crystal oscillator used in the method of measuring CI of a crystal unit of the invention.

In order to constant-power-drive the crystal unit XTAL1 in the crystal oscillator shown in FIG. 1, the crystal oscillator shown in FIG. 5 comprises a multiplier MUL1 for multiplying an input AC voltage v1 and an output AC voltage v2 of the AGC amplifier GV1, a smoothing circuit LEV1 for smoothing an output ripple voltage of the multiplier MUL1 to provide DC voltage Vp as an output, and a relative-amplifier COMP1 for relative-amplifying an output DC voltage Vp of the smoothing circuit LEV1 and a DC voltage VP for setting crystal unit driving power.

In the multiplier MUL1, two input terminals thereof are connected to an input side terminal and an output side terminal of the AGC amplifier GV1, respectively, for input of the input AC voltage v1 and the output AC voltage v2 of the AGC amplifier GV1. An input terminal of the smoothing circuit LEV1 is connected to an output terminal of the multiplier MUL1. Further, a minus input terminal of the relative-amplifier COMP1 is connected to an output terminal of the smoothing circuit LEV1. A DC voltage VP for setting crystal unit driving power is provided to a plus input terminal of the relative-amplifier COMP1 from another circuit or a separate element.

An output voltage of the relative-amplifier COMP1 thus connected is applied to the AGC amplifier GV1 as a DC input voltage VAGC.

The result of multiplication of the input AC voltage v1 and the output AC voltage v2 of the AGC amplifier GV1 by means of the multiplier MUL1 in the above-described crystal oscillator would be as expressed by the following formula:

$$v1 = \frac{ix}{\omega \cdot CI}$$

$$v2 = GV1 \cdot v1$$

$$= \omega^2 \cdot CI \cdot C2 \cdot R1 \cdot CI \cdot V1$$

$$= \omega \cdot C2 \cdot R1 \cdot CI \cdot ix$$

$$\therefore v1 \cdot v2 = \frac{C2}{CI} \cdot R1 \cdot CI \cdot ix^2$$

$$= \frac{C2}{CI} \cdot R1 \cdot P_D$$

where, $$P_D = ix^2 \cdot CI$$

In this formula, $P_D$ is a driving power of the crystal unit XTAL1.

The above formula does not contain a $\omega$ term. This means that it is not necessary to make a correction of the oscillated angular frequency. Further, because the input AC voltage v2 are of the same phase, an multiplication of these values necessarily results in a positive value, and the average thereof is proportional to the driving power $P_D$. It is consequently possible to easily obtain a DC voltage Vp by only smoothing the output ripple voltage of the multiplier MUL1 by means of the smoothing circuit LEV1.

By means of the crystal oscillator shown in FIG. 5, therefore, easy constant-power driving can be achieved without correcting the frequency of the crystal oscillator XTAL1, and it is possible to obtain CI of the constant-power-driven crystal unit XTAL1 easily and at a high accuracy by measuring the DC input voltage VAGC.

As shown in the foregoing FIGS. 1, 3, 4 and 5, the method of measuring CI of a crystal unit of the present invention permits easy and accurate measurement of CI of a crystal unit by the utilization of the condition for sustained oscillation of a crystal oscillator that the amplification rate of an AGC amplifier forming the crystal oscillator is proportional to CI.

The crystal oscillator provided with an integrating circuit in the output section thereof, used in the method of measuring CI of the present invention as described above, for example, that shown in FIGS. 4 and 5, permits easy correction of conversion of CI caused by the oscillated frequency, and high-accuracy measurement of CI of a crystal unit having a wide-band frequency.

EMBODIMENT 5

Figure 6:
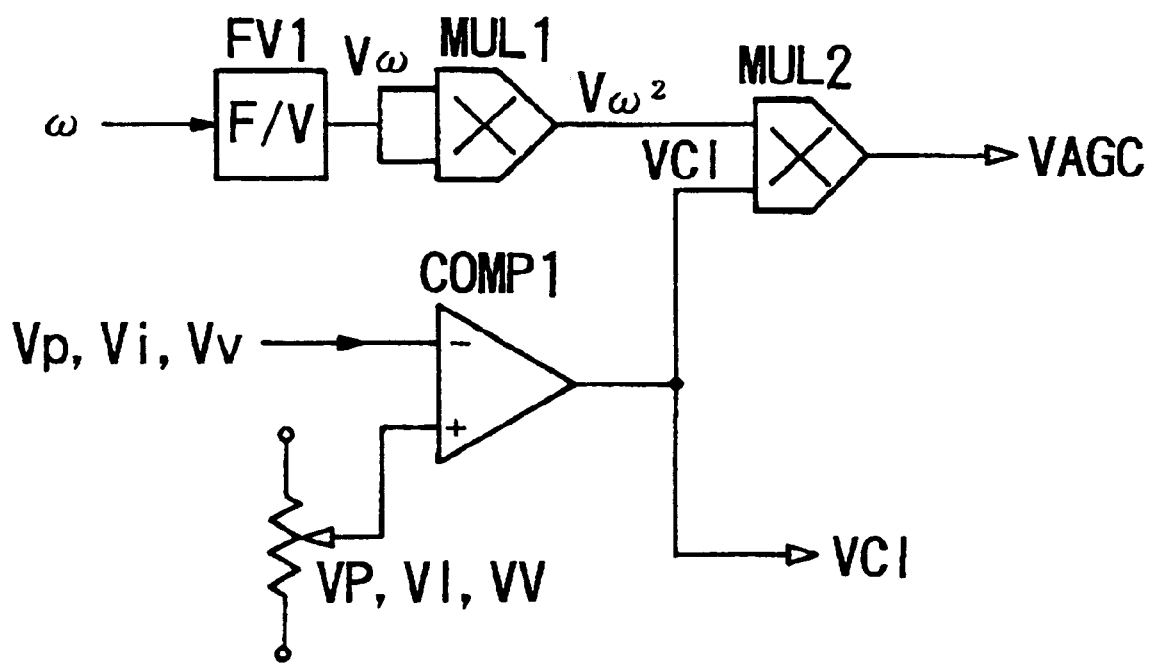

FIG. 6 illustrates another embodiment of the generating circuit of a DC input voltage VAGC to the crystal oscillator used in the method of measuring CI of a crystal unit of the invention.

The generating circuit of a DC input voltage VAGC shown in FIG. 6 can cope with a constant power, a constant current and a constant voltage, and a frequency correcting circuit is provided for achieving a wider band.

In FIG. 6, FV1 is a frequency-to-voltage (F-V) converter which generates a DC voltage $V\omega$ proportional to the input angular frequency $\omega$, and MUL1 is a first multiplier which is connected to the output side of the F-V converter and squares the DC voltage $V\omega$ which is an output of the F-V converter. COMP1 is a relative-amplifier which generates a control voltage VCI by relative-amplifying a set power value VP setting a constant power and a detected value Vp of a DC voltage for constant-power driving, or relative-amplifying a set current value VI setting a constant current and a detected value Vi of a DC voltage for constant-current driving, or relative-amplifying a set voltage value VV setting a constant voltage and a detected value Vv of a DC voltage for constant-voltage driving. MUL2 is a second multiplier of which two input terminals are connected, respectively, to the output terminal of the first multiplier MUL1 and the output terminal of the relative-amplifier COMP1, and multiplies a squared DC voltage $V\omega^2$ from the first multiplier MUL1 and a control voltage VCI from the relative-amplifier COMP1. This second multiplier MUL2 generates a DC input voltage VAGC, and the thus generated DC input voltage VAGC is sent to the AGC amplifier provided in the crystal oscillator used in the method of measuring CI of a crystal unit of the invention.

In this DC input voltage VAGC generating circuit, the first multiplier MUL1 is a low-speed AGC amplifier, and the second multiplier is also a low-speed AGC amplifier. As shown in FIG. 6, by providing the low-speed AGC amplifiers in the first section of the high-speed AGC amplifier, the amount of change in DC input voltage VAGC would be ten times as large when, for example, CI becomes 1/1000 upon increase in input angular frequency $\omega$ to a 100 times as high.

That is, by the presence of the DC input voltage VAGC generating circuit shown in FIG. 6, it is possible to stably generate a DC input voltage VAGC with a slight amount of change even upon a change in input angular frequency $\omega$. By the DC input voltage VAGC with a slight amount of change from the DC input voltage VAGC generating circuit, the AGC amplifier in the crystal oscillator shown in the foregoing FIG. 1 is driven at a high linearity, and it is therefore possible to measure CI of the crystal unit at a high accuracy within a wider range of frequencies.

Since, in the crystal oscillator of the invention having the integrating circuit provided in the output section, it is possible to disregard fluctuations of the oscillation frequency caused by changes in CI, hence to obtain a high-stability output. The integrating circuit may be one composed of a resistance R1, a capacitance C1 and an amplifier AV, as provided in the crystal oscillator shown in the foregoing FIGS. 1, 4 and 5.

It is needless to mention that the invention is not limited to the embodiments shown above, but various other embodiments are possible.

According to the present invention, as described above in detail, there are provided a novel CI measuring method and circuit of a crystal unit which permits easy and high-accuracy measurement of CI of various crystal units having an oscillation frequency within a wide band and a CI value with a broad range, and a novel crystal oscillator which provides a highly stable output.

I claim:

1. A crystal oscillator for measuring crystal impedance of a crystal unit, by measuring a DC input voltage, as representing crystal impedance of a crystal unit, comprising:

an integrating circuit provided in an output section of the crystal oscillator providing a frequency oscillated from the crystal unit as an output; and one or more AGC amplifiers having an amplification rate proportional to a DC input voltage provided between the crystal unit and the integrating circuit.

2. The crystal oscillator for measuring crystal impedance of a crystal unit according to claim 1, further comprising:

a multiplier which multiplies an input AC voltage and an output AC voltage of the AGC amplifiers;

a smoothing circuit which smoothes a ripple voltage provided by said multiplier circuit into a DC voltage; and a relative-amplifier circuit which relative-amplifies a DC voltage output from said smoothing circuit and a DC voltage for setting crystal unit driving power.

3. A crystal oscillator for measuring crystal impedance of a crystal unit by measuring a DC input voltage, as representing crystal impedance of a crystal unit, wherein said crystal oscillator consists of a Colpitts crystal oscillator comprising at least one AGC amplifier having an amplification rate proportional to a DC input voltage.

4. The crystal oscillator for measuring crystal of a crystal unit according to claim 1 or claim 3, wherein said crystal oscillator further comprises a second AGC amplifier having an amplification rate proportional to a square of an oscillated angular-frequency provided between the crystal unit and the integrating circuit.

5. The crystal oscillator for measuring crystal impedance of a crystal unit according to claim 4, wherein a DC input voltage to be provided to the crystal oscillator is generated by a DC voltage generating circuit comprising:

a frequency-to-voltage converter which generates a DC voltage proportional to an oscillated angular-frequency;

a primary multiplier which squares a DC voltage generated from the frequency-to-voltage converter;

a relative-multiplier which performs a relative-multiply of power regulating constant power and a DC voltage proportional to power, or relative-multiply of current regulating constant current and a DC voltage proportional to current, or multiply of voltage regulating constant voltage and DC voltage proportional to voltage; and a secondary multiplier which multiplies a squared DC voltage generated form the primary multiplier and DC voltage generated from the relative-multiplier.

6. The crystal oscillator for measuring crystal impedance of a crystal unit according to any one of claims 1, 2 or 4 wherein a DC input voltage to be provided to the crystal oscillator is generated by a DC voltage generating circuit comprising:

frequency-to-voltage converter which generates a DC voltage proportional to an oscillated angular-frequency;

a primary multiplier which squares a DC voltage generated from the frequency-to-voltage converter;

a relative-multiplier which performs a relative-multiply of power regulating constant power and a DC voltage proportional to power, or relative-multiply of current regulating constant current and a DC voltage proportional to current, or multiply of voltage regulating constant voltage and DC voltage proportional to voltage; and a secondary multiplier which multiplies a squared DC voltage generated from the primary multiplier and DC voltage generated from the relative-multiplier.

* * * * *

UNITED STATES PATENT AND TRADEMARK OFFICE
CERTIFICATE OF CORRECTION

PATENT NO.:    5,959,505
DATED     :    September 28, 1999
INVENTOR(S):   Hajime USHIYAMA It is certified that error appears in the above-identified patent and that said Letters Patent is hereby corrected as shown below:

IN THE CLAIMS:

Claim 5, line 14, change "multiply" to --relative-multiply --.

Claim 6, line 2, change "1,3 or 2" to --1, 2 or 3--;
line 15, change "multiply" to --relative-multiply --.

Signed and Sealed this

Fourth Day of July, 2000

Attest:

Q. TODD DICKINSON

*Attesting Officer*          *Director of Patents and Trademarks*